(12) United States Patent
Allen et al.

(10) Patent No.: US 7,483,196 B2
(45) Date of Patent: Jan. 27, 2009

(54) APPARATUS FOR MULTIPLE BEAM DEFLECTION AND INTENSITY STABILIZATION

(75) Inventors: Paul C. Allen, Beaverton, OR (US); Alan J. Wickstrom, Beaverton, OR (US); Bryan C. Bolt, Beaverton, OR (US)

(73) Assignee: Applied Materials, Inc., Santa Clara, CA (US)

( * ) Notice: Subject to any disclaimer, the term of this patent is extended or adjusted under 35 U.S.C. 154(b) by 672 days.

(21) Appl. No.: 10/698,822

(22) Filed: Oct. 30, 2003

(65) Prior Publication Data
US 2005/0061981 A1  Mar. 24, 2005

Related U.S. Application Data

(60) Provisional application No. 60/505,116, filed on Sep. 23, 2003.

(51) Int. Cl.
*G02F 1/09* (2006.01)
*G02F 1/33* (2006.01)

(52) U.S. Cl. .......................... 359/285; 359/305; 359/307

(58) Field of Classification Search ................. 359/285, 359/305, 307, 290, 291, 292, 295, 298
See application file for complete search history.

(56) References Cited

U.S. PATENT DOCUMENTS

| | | | |
|---|---|---|---|
| 4,203,672 A * | 5/1980 | Smith, Jr. ..................... | 356/431 |
| 4,309,225 A * | 1/1982 | Fan et al. ....................... | 438/72 |
| 4,692,877 A | 9/1987 | Byerly et al. ................ | 364/514 |
| 4,796,038 A | 1/1989 | Allen et al. ..................... | 354/4 |
| 4,797,696 A | 1/1989 | Allen et al. ..................... | 354/4 |
| 5,018,807 A | 5/1991 | Shirota ........................ | 350/6.8 |
| 5,235,438 A | 8/1993 | Sasada ........................ | 358/481 |
| 5,359,434 A * | 10/1994 | Nakao et al. ................. | 358/481 |
| 5,386,221 A | 1/1995 | Allen et al. ................. | 346/108 |
| 5,594,556 A | 1/1997 | Vronsky et al. ............. | 358/482 |
| 5,635,976 A | 6/1997 | Thuren et al. ................ | 347/253 |
| 5,798,784 A | 8/1998 | Nonaka et al. | |

(Continued)

FOREIGN PATENT DOCUMENTS

WO  WO-98/27450  6/1998

(Continued)

OTHER PUBLICATIONS

Allen, Paul C. "Laser Scanning for Semiconductor Mask Pattern Generation," Proceedings of the IEEE, vol. 90, No. 10, pp. 1653-1669 (2002).

European Search Report issued for EP 04 784 504.5, dated Jan. 28, 2008.

(Continued)

*Primary Examiner*—Ricky L Mack
*Assistant Examiner*—Brandi N Thomas
(74) *Attorney, Agent, or Firm*—Wilmer Cutler Pickering; Hale and Dorr LLP

(57) ABSTRACT

A multiple beam generator for use in a scanning system, wherein the generator includes an acousto-optic deflector (AOD) which during use receives a laser beam and generates a deflected beam, the deflection of which is determined by an AOD control signal; a diffractive element which generates an array of input beams from the deflected beam; and a control circuit which during operation generates the AOD control signal and varies a characteristic of the first control signal to account for errors in the scanning system.

21 Claims, 10 Drawing Sheets

U.S. PATENT DOCUMENTS

| | | | |
|---|---|---|---|
| 5,890,789 A * | 4/1999 | Inagaki et al. | 359/305 |
| 6,178,028 B1 | 1/2001 | Washiyama et al. | |
| 6,288,818 B1 | 9/2001 | Yoshimaru et al. | |
| 6,731,320 B1 * | 5/2004 | Allen et al. | 347/233 |
| 2002/0167583 A1 | 11/2002 | Binford et al. | |
| 2005/0151052 A1 * | 7/2005 | Jutte et al. | 250/201.5 |

FOREIGN PATENT DOCUMENTS

| | | |
|---|---|---|
| WO | WO-00/02424 | 1/2000 |
| WO | WO 00/57629 | 9/2000 |
| WO | WO-01/71655 | 9/2001 |

OTHER PUBLICATIONS

Allen, P. C. et al.: "Next-generation DUV ALTA mask patterning capabilities" Proceedings of the SPIE—The International Society for Optical Engineering SPIE-Int. Soc. Opt. Eng USA, VOL. 5567, No. 1, 2004, pp. 279-290, XP002450281 ISSN: 0277-786X.

Allen P C et al:, "Next Generation DUV ALTA Mask Patterning Capabilities" Proceedings of the SPIE—The International Society for Optical Engeneering SPIE-INT, Soc. Opt. Eng USA, vol. 5567, No. 1, 2004, pp. 279-290, XP002450281, ISSN: 0227-786X pp. 280-281, paragrah 2.2.

European Patent Office Supplementary European Search Report, Sep. 27, 2007.

* cited by examiner

APPARATUS FOR MULTIPLE BEAM DEFLECTION AND INTENSITY STABILIZATION

CROSS-REFERENCE TO RELATED APPLICATION

This application claims benefit under 35 U.S.C. §119(e) of provisional application No. 60/505,116, file don Sep. 23, 2003.

TECHNICAL FIELD

The invention relates generally to systems and methods for generating an array of beams for use in another system such as a high-speed laser pattern generator.

BACKGROUND

Photolithography provides tools and techniques for patterning the various layers that make up semiconductor integrated circuits. In general, a mask layer of photosensitive material is deposited onto the semiconductor wafer that is to be patterned. Then, the photolithographic tool is used to expose predetermined areas of the photosensitive mask material thereby "printing" a mask pattern onto the photosensitive layer. After exposure, the photosensitive layer is "developed" and the unexposed regions are removed thereby leaving openings through which further processing of the semiconductor wafer can take place. The pattern on the wafer can be generated in the photo-resist layer by projecting the pattern onto the material through a mask having the appropriate design.

Masks are also patterned with photo-resist by printing them with a process mask like a laser printer prints a pattern on paper. That is, the pattern generator tool simply scans the surface of the photo-resist with a light beam having a wavelength to which the photo-resist is sensitive. Depending on the characteristics of the photo-resist, different sources of light or radiant energy are used, including ultraviolet light, visible light, coherent light, x-rays and electron beam (E-Beam).

High throughput laser pattern generators have been developed to print onto the photo-resist with multiple beams so as to increase their area coverage rate (i.e., throughput). In such systems, an array of beams is generated by using one of several different techniques. One technique involves using assemblies of discrete mirrors and beam splitters. Another involves using an assembly of plates of different thicknesses to produce beams separated a controlled distance by using front and back surface reflections. (See U.S. Pat. No. 4,797, 696). Still another technique involves using a diffractive optical element to generate a fan of beams that is focused to an array using a lens. The individual beams then pass through a multiple channel acousto-optic modulator to turn the beams on and off or to impart gray levels to them. The array is scanned down stream in the writing system by some deflection means, typically a rotating mirror polygonal scanner or an acousto-optic deflector. Such systems are described in U.S. patent application entitled Laser Pattern Generator, Skjerven Morrill Docket M-5487, and U.S. Pat. Nos. 4,796,038; 5,386, 221; and 5,635,976.

The accurate placement of the beams on the work piece is essential for writing patterns for producing semiconductors. Errors in stage position or beam wander can be compensated in the scan direction by adjusting the timing of the modulation of the beams. A piezo-electric actuated mirror is typically used in the horizontal axis or cross-scan but these are limited in frequency response to about 1 kHz.

The control of laser beam intensity noise is important so that all features receive the desired dose and have the same dimension when the resist is developed.

SUMMARY

In general, in one aspect, the invention features a multiple beam generator for use in a scanning system. The generator includes an acousto-optic deflector (AOD) which during use receives a laser beam and generates a deflected beam, the deflection of which is determined by an AOD control signal; a diffractive element which generates an array of input beams from the deflected beam; and a control circuit which during operation generates the AOD control signal and varies a characteristic of the first control signal to account for errors in the scanning system.

Other embodiments include one or more of the following features. The control circuit receives a feedback signal that is a measure of a deflection error of an output beam array from a desired position, wherein the output beam array is derived from the input beam array and wherein the control circuit generates the AOD control signal to reduce the deflection error. The generator also includes an acousto-optic modulator (AOM) which receives the array of beams a separately modulates each of the received beams in accordance with a second control signal to produce an output beam array. The generator control circuit includes a table of corrections which the control circuit uses to generate the AOD control signal. The table of corrections stores: (1) corrections for stripe position errors associated with the scanning system; (2) corrections for variation in beam velocity over a scan line within the scanning system; and (3) corrections for facet-by-facet position error attributable to a polygon mirror in the scanning system. The generator control circuit includes another table of corrections for intensity errors associated with the scanning system. The other table stores: (1) corrections for scan-line intensity variations within the scanning system; (2) corrections for intensity variation from stripe deflection across a sound field within the AOM; and (3) corrections for intensity variation due to reflectivity variations within a polygonal scanning element that is part of the scanning system.

In general, in another aspect, the invention features a beam deflection control system that includes a generator that during operation generates a first array of beams; a scanning element that during operation receives a second array of beams derived from the first array of beams and scans the second array of beams over a scan region; a deflection measurement circuit including a chevron pattern detector across which one of the beams of the scanned array of beams scans during operation; and a control circuit which during operation receives a feedback signal from the deflection measurement circuit that is a measure of a deflection error between the output beam array and a desired position, wherein the control circuit generates the first control signal to reduce the deflection error. The chevron pattern detector generates a signal that is a measure of the location of the scanned array of beams in a direction transverse to the scan direction. It includes an angled slit across which one of the beams passes.

Other embodiments include one or more of the following features. The generator includes an acousto-optic deflector which during use receives a laser beam and generates a deflected beam, the deflection of which is determined by a first control signal; and a diffractive element which generates the first array of beams from the deflected beam. The chevron pattern detector also includes a vertical slit, and a first plurality of angled slits and a second plurality of angled slits symmetrically oriented with respect to the first plurality of slits.
}

The chevron pattern detector is characterized by a path along which the beam passes during operation and it also includes a detector region along that path for determining whether the beam is properly aligned over the path.

In general, in yet another aspect, the invention features a method of measuring deflection of scanned beams. The method involves scanning a selected beam of an array of beams over a first zone and scanning multiple beams of the array of beams over a second zone; while scanning over the first zone, passing the selected beam over a chevron pattern detector to generate a detection signal; and using the detection signal to determine a position of the selected beam in a direction that is transverse to the scanning direction.

Other embodiments include one or more of the following features. The detection signal is a timing signal and the step of using the detection signal involves measuring a duration of the timing signal to determine the position of the selected beam. The chevron pattern detector also includes a vertical slit and a first group of one or more angled slits and wherein the scanning involves passing the selected beam over the vertical slit and the first group of one or more angled slits. The vertical slit is oriented orthogonal to the direction of movement of the selected beam and the one or more angled slits are oriented at a non-orthogonal angle relative to the direction of movement of the selected beam. The chevron pattern detector also includes a second group of one or more angled slits, wherein the scanning involves passing the selected beam over the vertical slit and both groups of one or more angled slits. The slits of the first group of one or more angled slits are oriented at a non-orthogonal angle relative to the direction of movement of the selected beam and the slits of the second group of one or more angled slits is symmetrically oriented with respect to the slits of the first group of angled slits. The chevron pattern detector is also characterized by a path over which the selected beam passes during operation and the chevron pattern detector further includes a detector region along that path for determining whether the selected beam is properly aligned to pass over that path. The method further includes detecting whether the selected beam is passing over the detector region.

The module described herein improves the laser spot position control and intensity control as compared to existing systems. It provides a fast means for positioning the beam array in the cross-scan axis to correct for stage errors or beam displacement errors. And it reduces the intensity fluctuations of the exposing beams.

The details of one or more embodiments of the invention are set forth in the accompanying drawings and the description below. Other features, objects, and advantages of various embodiments of the invention will be apparent from the description and drawings, and from the claims.

DETAILED DESCRIPTION

Figure 1:
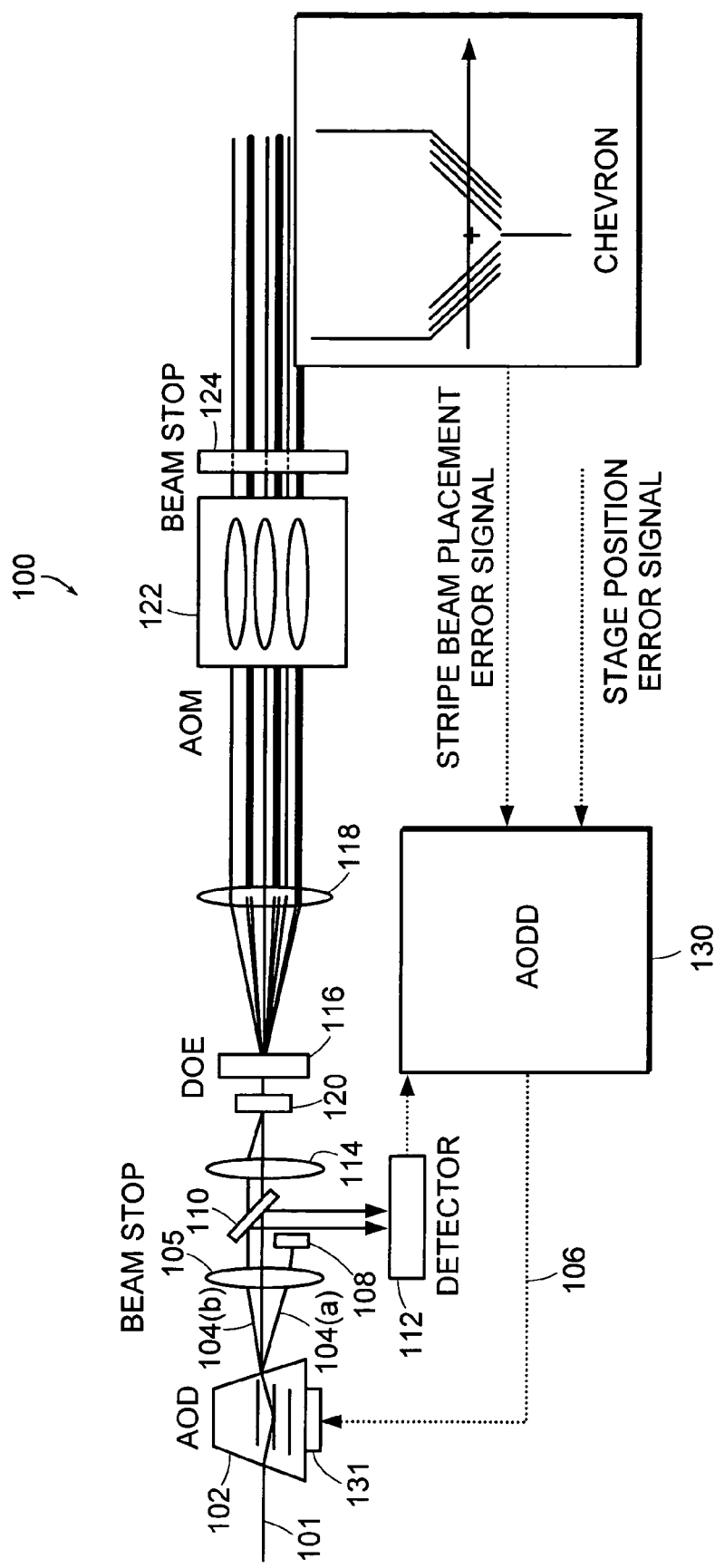
FIG. 1 is a schematic representation of a system for generating an array of beams for a photolithographic printing tool such as is shown in FIG. 2 (also referred to as the brush module).
Figure 2:
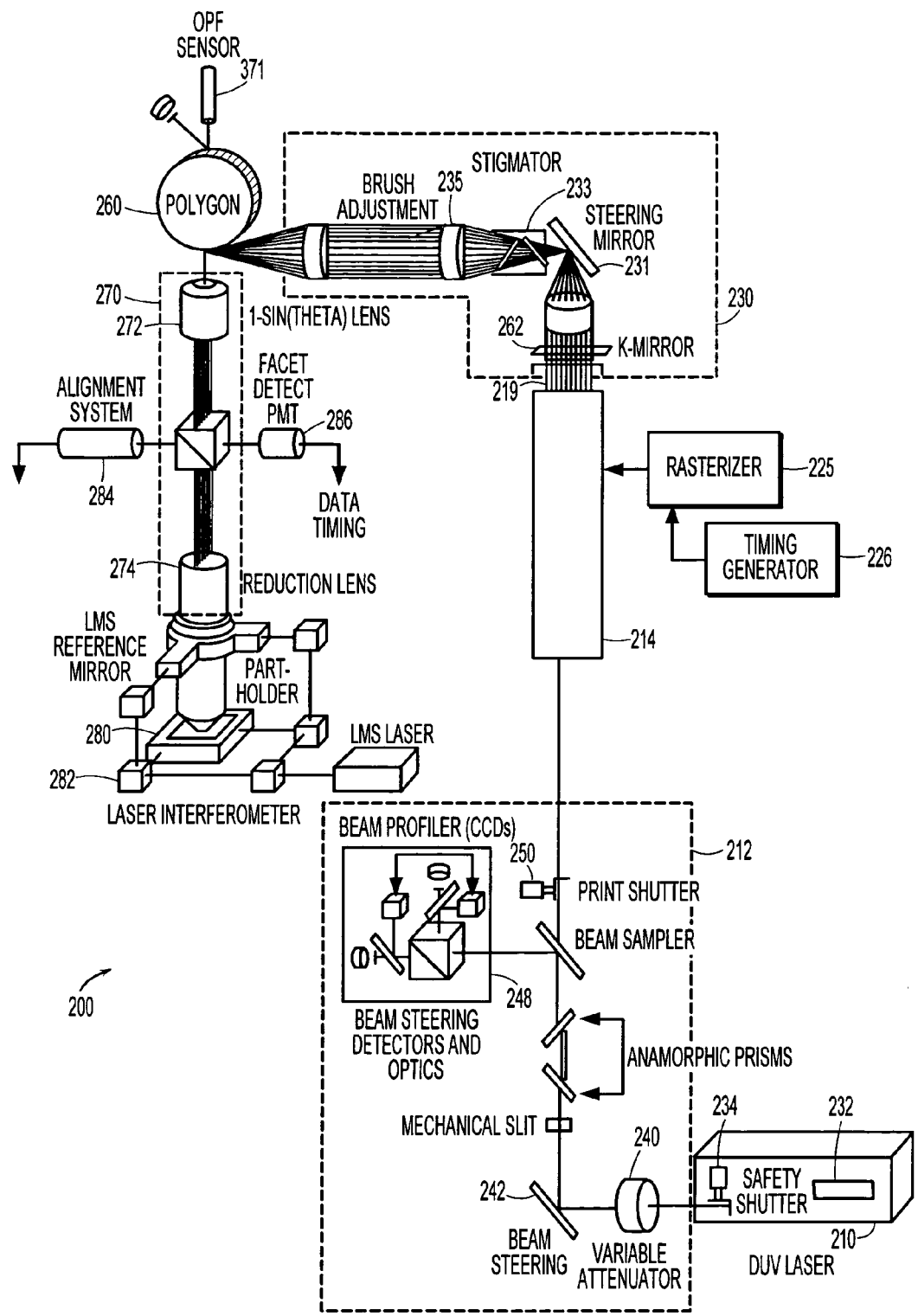
FIG. 2 is a schematic representation of a photolithographic printing tool which includes the beam array generating system of FIG. 1.

FIG. 1 shows an optical system (or brush module) 100 for generating multiple laser beams (e.g. a 32 beam array) for a photolithographic system such as is shown in FIG. 2. In general, the system includes a closed loop feedback control system that reduces the intensity fluctuations of the beams during scanning and which also provides a fast way to position the beam array in a cross-scan direction to correct for stage errors or beam displacement errors within the lithographic equipment. It also includes an open loop table driven modification of beam intensity and position to correct for various other errors that characterize such systems, as will be discussed in greater detail below.

In brush module 100, a laser beam 101 enters an acousto-optic deflector (AOD) 102 and is diffracted into two beams, namely, a zero-order beam 104(a) which is undeflected, and a first order beam 104(b) which is deflected at an angle that is linearly proportional to the frequency of an RF input signal 106 into the device. The beams from AOD pass through a lens system 105 (represented schematically by a single element) that collimates the beams. After lens system 105, a beam stop 108 blocks out the zero-order beam and a beam splitter 110 samples the other higher diffraction orders of the beam by directing a small percentage of the signal to a detector 112. The higher diffraction orders of the beam that pass through beam splitter 110 pass through another lens system 114 which focuses them onto a diffractive optical element (DOE) 116 after passing through a half-wave plate 120. DOE 116 creates an array of equal intensity, equally spaced beams in angle space, i.e., a fan of beams. The array of equally spaced beams then passes through another lens system 118 and then into a multiple channel acousto-optic modulator element (AOM) 122. Lens system 118 focuses the fan of beams into a parallel array of beams inside AOM 122. Half-wave plate 120 rotates the polarization of the beams by 90 degrees for efficient interaction inside AOM 122. At the output of AOM 122, another beam stop 124 removes the zero order beams, thereby preventing them from propagating downstream. AOM 122 modulates each of the beams independently with gray levels.

AOM 122 is a block of material such as fused silica having a patterned layer of lithium niobate bonded to one surface. Electric signals applied to contacts lithographically defined in a conducting layer overlying the lithium niobate layer create multiple acoustic waves. Each acoustic wave propagates through the path of an associated input beam in the block, deflects the associated input beam, and controls the intensity reaching an aperture that selects the diffracted beam.

The sampled optical signal is fed back to a control system that includes an AOD driver 130. AOD driver 130 generates an RF signal that drives a transducer 131 in AOD 102 and controls the amount by which the array of beams is deflected. AOD driver 130 receives error signals from other parts of the lithography system, including a stripe, (cross-scan), beam placement error signal 132 and a stage position error signal 134, and corrects for these errors by deflecting the array of beams appropriately. Stripe beam placement error signal 132 is generated through a facet detect timing measurement that is done at the beginning of a scan, the basic principles of which will be described shortly.

The control system has two general purposes. First, it adjusts the frequency of the RF signal to AOD 102 such that the combined error signal from the cross-scan beam placement detector and the stage position error signal is nulled or compensated for. Second, it adjusts the amplitude of the RF signal so that the intensity detector signal remains constant. In other words, it corrects both intensity errors and relative position errors between the cross-scan beam position and desired stage position.

In general, the stripe beam placement error is generated by scanning one of the beams over an array of slits just before they enter the region during which printing will occur. In its simplest form the array of slits can be simply two slits, one vertical slit oriented perpendicular to the scan direction followed by an angled slit. In essence the arrangement looks like: | □. Behind the slits is a detector system including one or more detectors that are used to indicate the time at which the beam crosses each slit. The signal from the beam passing over the first slit is used as a start of scan or facet detect signal to time the modulation of the data. The time interval between when the beam crosses the first slit and when it then crosses the second slit, denoted as $t_m$, is a measure of the displacement of the scan line (i.e., a measure of displacement of the scan line in a direction perpendicular to the scan direction). The difference of this time $t_m$ from a nominal time $t_o$ is used to adjust the frequency f of the RF signal driving the AOD beam steering device. Thus, $f=c(t-t_o)$ where c is a constant determined by calibrating the change in t with frequency. The frequency is adjusted and since the sound waves in the AOD are fast relative to the scan speed, one is able to correct for individual facet to axis errors on a polygonal scanner within the downstream scanning system, to be described later.

Before presenting a more detailed description of the design and operation of optical system of FIG. 1, it would be useful to describe the photolithographic system in which this system is used and the nature of the various errors that need to be corrected in that system. An example of a typical lithographic system 200 is shown in FIG. 2.

In essence, photolithographic system 200 is a precision printing system that scans an image (e.g. of a circuit mask) onto a photosensitive layer on the surface of a mask or semiconductor wafer. A pre-scan portion of system 200 includes a laser beam source 210, a beam control module 212, a brush module 214, and pre-scan optics 230.

Laser beam source 210 includes a laser 232 that generates a coherent beam of suitable power and wavelength for the printing that is to be performed. It also includes other elements such as a safety shutter 234, which blocks the beam except when it is needed within the rest of the system. Beam control module 212 includes a variable attenuator 240, a beam steering element 242, circuitry 248 to measure and control the profile shape, location, and direction of the beam, and a print shutter 250, which turns the beam on and off during the printing operation, and other optical beam shaping elements (including, for example, anamorphic prisms), all of which is to among other things control the distortion of the beam and to adjust the beam size so that it is the appropriate diameter for the AOD and the AOM.

From the single input beam and in the manner described above, brush module 214 generates multiple input beams 219 that are spaced along a line to form a linear array or "brush" of modulated input beams 219.

The acoustic waves in the AOM that is within brush module 214 are oriented so that each beam brightens in a direction perpendicular to the line of beams as the AOM turns on the beams. In general, pre-scan optics 230 direct the line of modulated input beams onto a scanning element 260 so that the scanning direction resulting from movement of the scanning element is opposite to the brightening direction of beams. Pre-scan optics 230 typically also includes rotation optics 262, such as a K mirror or a dove prism that rotates the line of the brush to align the brightening and scan directions. It might also include another steering mirror 231, a stigmator 233 for aligning the focal points of the two axes, and a brush adjustment (condenser) lens system 235 to focus the array of beams onto scanning element 260.

Scanning element 260 directs multiple scan beams into post-scan optics system 270. In the described embodiment, scanning element 260 is a rotating polygon mirror that during scanning rotates with a constant angular velocity. More specifically, the polygon mirror has 24 facets and spins at a high rate of speed (e.g. 20,000 RPM, which produces a facet rate of 8000 per second).

Post-scan optics 270 focus the scan beams as the scan beams sweep along scan lines on a surface of a workpiece. Post-scan optics 270 includes a scan lens 272 and a reduction lens 274. In the described embodiment, scan lens 272 is an F-sin($\theta$) lens, which reduces scan line bow for wide scan arrays. The F-sin($\theta$) lens is well known in the art (see, for example, U.S. Pat. No. 5,018,807 to Shirota and U.S. Pat. No. 5,235,438 to Sasada). Since lens 272 is an F-sin($\theta$) lens and scanning element 260 rotates with a uniform velocity, the scan beams which form scan lines on a workpiece move with non-uniform velocity in the image plane. A timing generator 226 provides a non-uniform pixel clock signal to synchronize modulation of the scan beams with the positions of the scan beams on the workpiece.

Reduction lens 274 reduces the scan line size and separation and the resulting image size as required for the image to be formed on the workpiece (e.g. a mask, a reticle, an unprocessed wafer, or a partially processed wafer that is coated with a layer of photo-resist). A precision stage system 280, which is monitored by an interferometer system 282, moves the workpiece as required for each stage pass and indexing after each stage pass. Alignment system 284 identifies the positions of alignment marks on the workpiece as viewed through reduction lens 274 and accordingly determines the position and orientation of the workpiece relative to the scan lines. Interferometer system 282 monitors the movement of the workpiece for indexing.

A rasterizer 225 generates the signals that create the acoustic waves that control the intensity of modulated beams 219. Rasterizer 225 divides each scan line into pixels and generates the signals as required for each pixel to have a desired intensity. For timing, a facet detection system 286 detects the orientation of scanning element 260 to identify the beginning of scan lines, and timing generator 226 generates pixel clock signals to identify the beginning of each pixel in a scan line. In the described embodiment, in which beams scan at a non-uniform rate, the pixel clock signal deviates from a uniform periodic signal. In other embodiments, the pixel clock signals have a constant period.

To provide the maximum space for separate acoustic waves that control individual beam intensities, the acoustic waves propagate along a direction perpendicular to the line of input beams 219. The direction of propagation of the acoustic waves is the same as the direction in which successive portions of a beam 219 become illuminated as the AOM turns on the beam. This direction is sometimes referred to herein as the brightening direction. In the described embodiment, the brightening direction for the scan beams at the image plane of system 200 is opposite the scan direction. This prevents the blur, skew, and line thickness bias between orthogonal features and between scan direction and cross-scan direction features. To prevent cross talk and overlap of adjacent beams, the AOM channels are separated by several beam diameters. The scan beams thus form a "brush" for simultaneous illumination of multiple scan lines that are separated from each other.

Referring back to FIG. 1, AOD 102 is able to deflect the laser beam over a narrow angle and also to function as a variable intensity modulator. In the described embodiment, the deflection input to the AOD is nominally a 200 MHz RF drive signal. In effect, the output beam of AOD 102 is pointed by varying the frequency of the RF, and varying the amplitude of the RF modulates the beam intensity.

The control system including AOD driver 130 reduces or eliminates the following sources of stripe position error:
1. The beam velocity varies over the length of the scan line due to corrections for scan nonlinearity. Since the stage is moving at a constant velocity (within a small error), the scan line does not make a straight line. Instead, it makes an "S" curved line.
2. The polygon mirror causes a facet-by-facet position error in the stripe direction.
3. Dynamic stripe position noise from the laser as well as from other parts of the system that may be of similar magnitude.
4. Residual stage position error (the difference between commanded steering mirror position and actual stripe position).

Each facet is divided into 32 regions or segments. The first three stripe position errors are corrected in each of 32 regions per facet by using predetermined corrections stored in corresponding tables. The residual stage error is corrected once for each facet by using predetermined corrections also stored in a table. The second error can also be corrected dynamically at the user's discretion.

The control system also reduces or eliminates the following sources of intensity error:
1. The laser intensity variation.
2. Scan-line intensity variation caused by reflectivity vs. angle-of-incidence changes, as well as glass path-length variations.
3. Intensity variation from stripe deflection across AOM sound field.
4. The surface finish and plating reflectivity of the polygon varies from facet to facet.

The first intensity error is corrected in a continuous closed loop. The last three intensity errors are corrected in each of 32 regions per facet by using predetermined corrections stored in corresponding tables.

The algorithms that perform each of these corrections will be described in greater detail after first giving an overview of the control system and its components.

Figure 3:
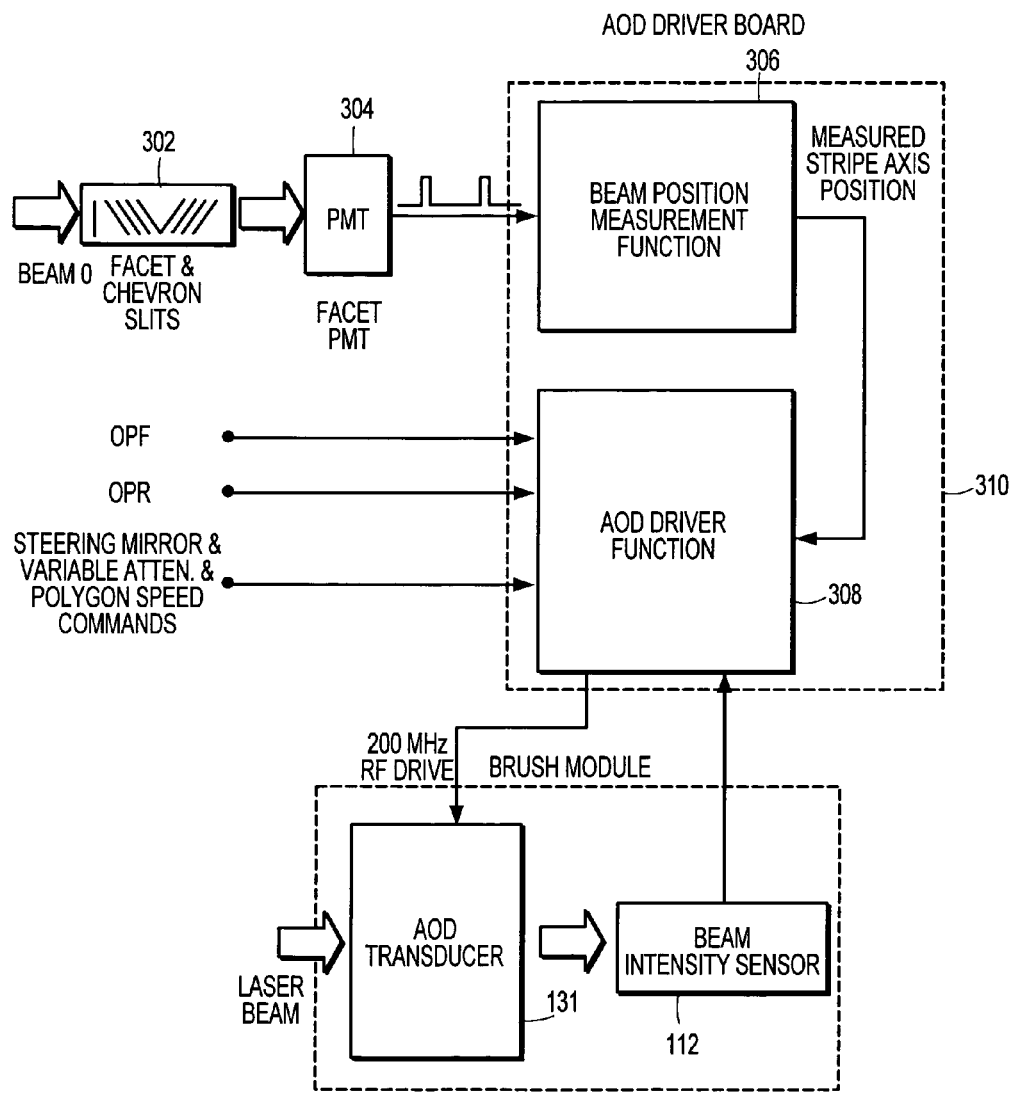
FIG. 3 shows the interactions of the key functions that are implemented in the described embodiment.

FIG. 3 outlines the interactions of the functions that are implemented in the control system. At the start of each facet, laser beam 0 (of laser beams 0-31) passes over a Chevron slit pattern 302 that produces pulses at the output of a sensitive light detector such as a photomultiplier tube (PMT) 304. The pulse pattern generated by PMT 304 indicates the position of Beam 0 in the cross-scan of the stripe direction. A beam position measurement function 306 decodes the pulse pattern and converts it to a digital position signal that is fed to an AOD Driver function 308 that is implemented by AOD Driver 310. This information, along with Steering Mirror Command, beam intensity, facet detect (FD), once-per-rev (OPR), and once-per-facet (OPF), are used by AOD Driver 310 to produce a 200 MHz carrier. This carrier has AM (intensity) and FM (deflection) components that drive an AOD transducer 131 controlling the beam.

Figure 4:
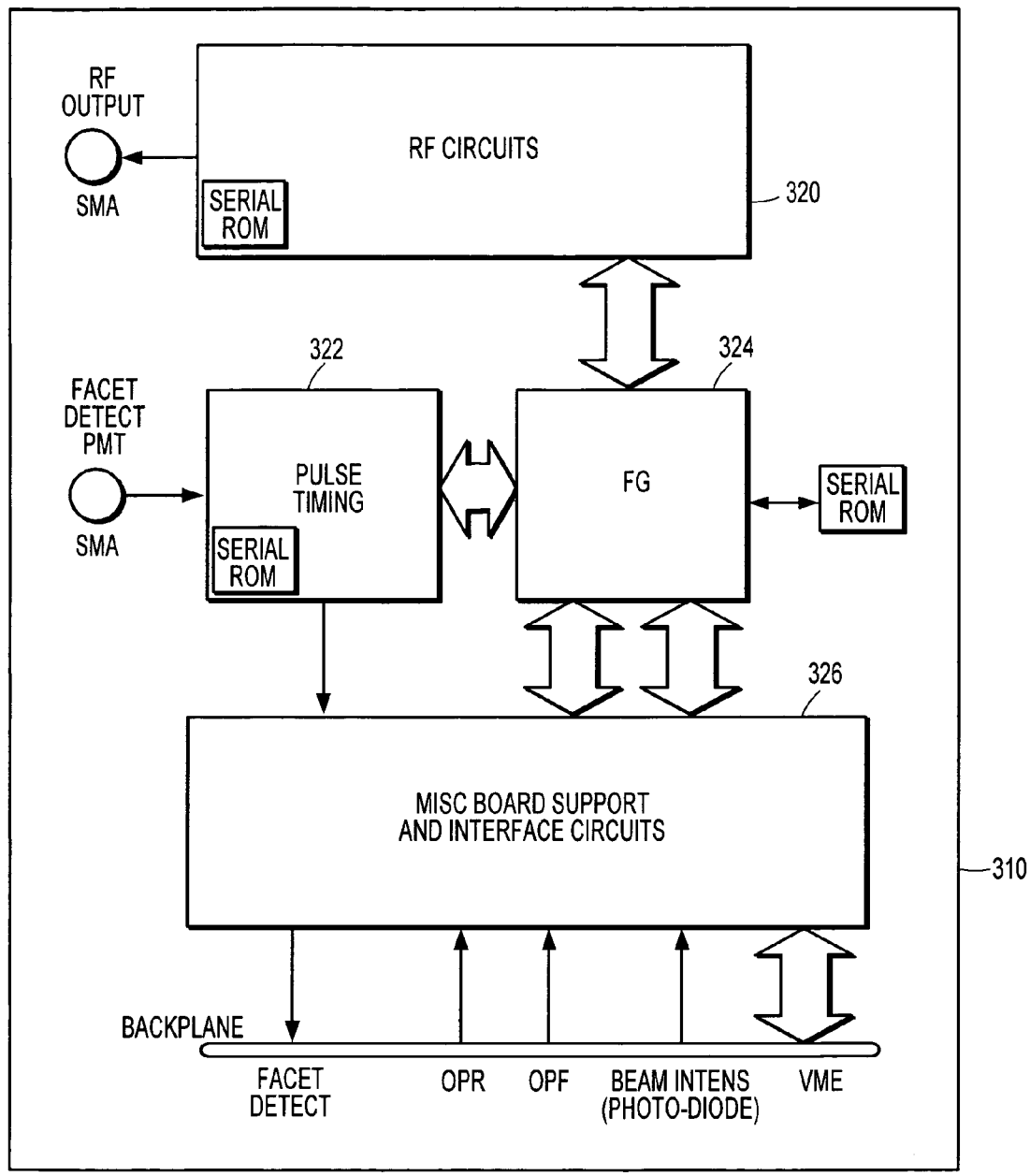
FIG. 4 is a block diagram of the AOD driver board.

Referring to FIG. 4, AOD driver board 310 includes an RF circuits module 320 and a pulse timing module 322. It also includes frequency and gain control (FG) module 324 and a miscellaneous circuits module 326. Miscellaneous circuits module 326 includes I/O buffers, A/D and D/A circuits for signals and test points, clock generation/distribution, and DC power management. AOD driver board 310 interfaces with: (1) brush module 214, which includes the AOD device in the beam path; (2) a motion control backplane which carries signals associated with the movement of the stage system; and (3) the multiple-slit (Chevron slit) laser spot position sensing system at the facet detect slit.

Figure 5:
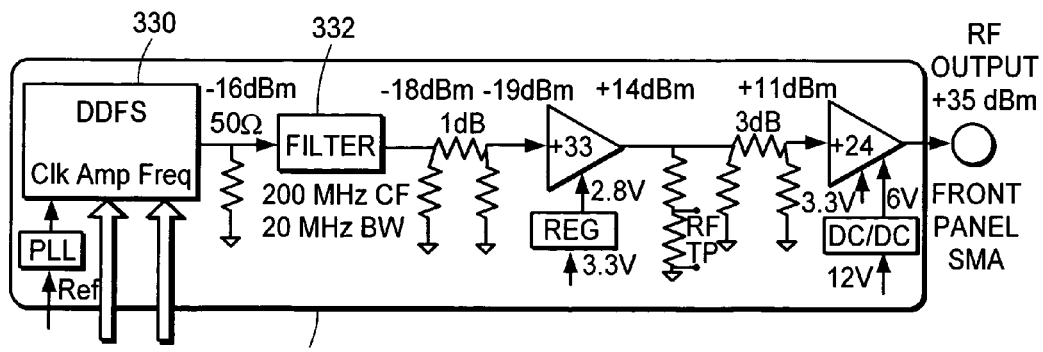
FIG. 5 is a block diagram of the RF circuits module shown in FIG. 4.

RF Circuits Module Architecture:

Referring to FIG. 5. the heart of RF circuitry 320 is a single chip Direct Digital Frequency Synthesizer (DDFS) 330 with on-chip DAC, which takes digital instructions and uses them to convert a high speed clock signal into a precision RF output signal. Since the DDFS output is generated digitally, the spectrum contains many "image" products formed from all combinations of the clock frequency and the programmed RF output frequency. Thus, a filter 332 around the operating band is used. This is generally a high order 0.1 dB Chebyshev filter so as to provide adequate rejection of undesired nearby images. In this particular case, the operating bandwidth is essentially at the maximum possible for conventional bandpass filter design. The filtered output is also amplified substantially using a two-stage approach.

Pulse Timing Module:

Pulse timing module 322 in FIG. 4 receives the facet detect (FD) signal and generates timing and counting signals that are used elsewhere in the system such as in the measurement of the stripe axis position error using the Chevrons.

Figure 6:
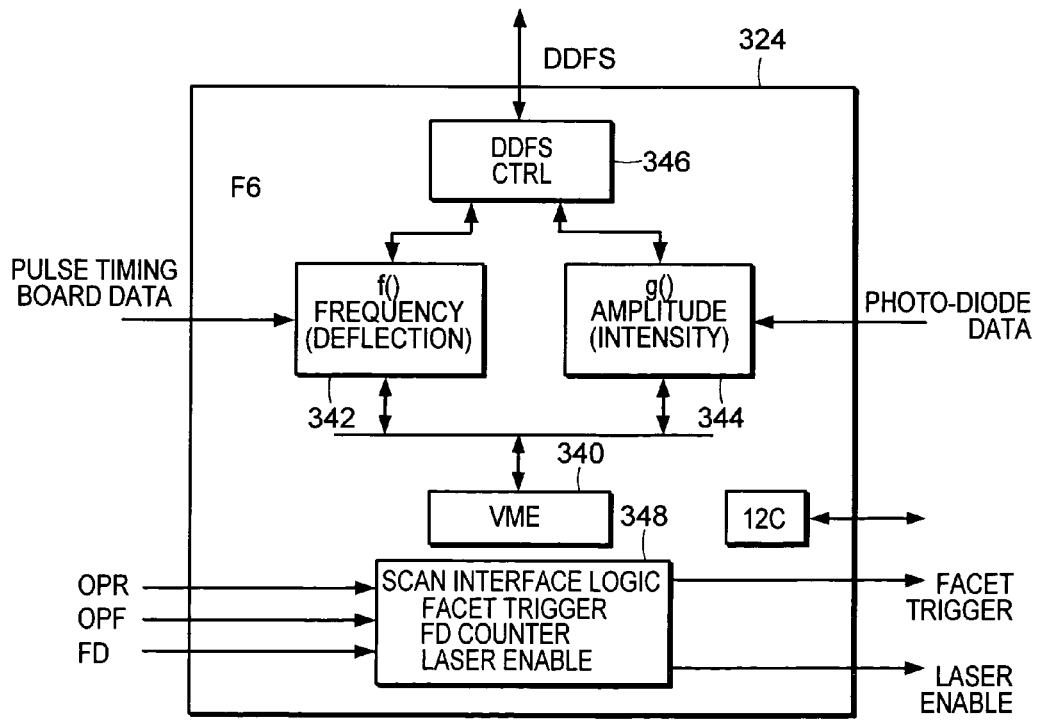
FIG. 6 is a block diagram of the frequency and gain (FG) control module shown in FIG. 4.

FG Module:

Referring to FIG. 6, FG module 324 has a scan interface logic block 348 and four additional main blocks. The four other blocks are a VME interface block 340, a frequency (i.e., deflection) block 342, an amplitude (i.e., intensity) block 344, and a DDFS control block 346. These blocks are discussed in order.

Scan Interface Logic:

Scan interface logic block 348 receives at least three signals, namely, an OPR (once-per-revolution) signal, an OPF (once-per-facet) signal, and an FD (facet detect) signal. It is responsible for using the polygon facet synchronized signals to generate the laser enable (LE) signals to the timing generator boards, facet trigger (FT) and internal AOD control loop synchronization signals. More specifically, in accordance with the operation of scan interface logic block 348, FG module 324 computes the current facet number from the OPR and OPF signal inputs. Facet number 0 is coincident with OPR. Subsequent facets after OPR are counted up from 0 up to 23. It also uses OPF and OPR to generate a facet trigger signal. FG module 324 generates a laser enable signal in order for the circuit to turn on its RF output to the AOM at the start of a facet. This allows facet detect to occur. FG module 324 asserts the laser enable signal when OPF occurs and it de-asserts the laser enable signal a number of cycles later (e.g. three core clock cycles after the last chevron pulse is received from pulse timing board 322. FG module 324 also sends a TG Facet Detect Enable (TG_FD_EN) to the AOD driver board to enable the facet detect to be sent to the timing generator boards elsewhere in the system.

Figure 7:
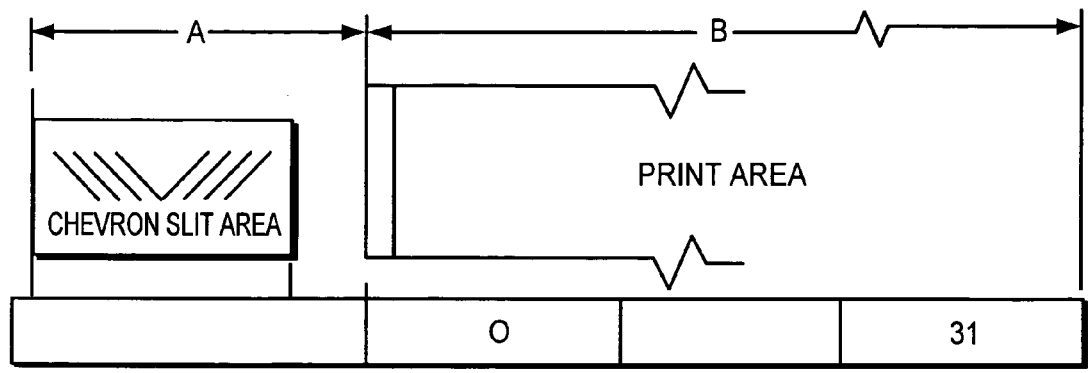
FIG. 7 shows the phases of operation during scanning.

The zones of the scan process are illustrated with the aid of the timing diagram shown in FIG. 7. During the first period, identified as zone A, one beam scans across the chevron (the other beams are turned off). During the second period, identified as zone B, the 32 beams scan across the print area. In general, the initial deflection correction takes place within zone A. This correction is then modified during zone B to account for scan related stripe deflection variations. Intensity corrections take place primarily during zone B. So, the intensity during period A is driven to a constant value in order to produce repeatable pulses from the facet detect PMT.

VME

VME block 340 contains the register interface. It is also responsible for "snooping" some of the values needed by the frequency algorithm implemented by frequency block 342 and the amplitude algorithm implemented by amplitude block 344.

Frequency Block

Figure 8:
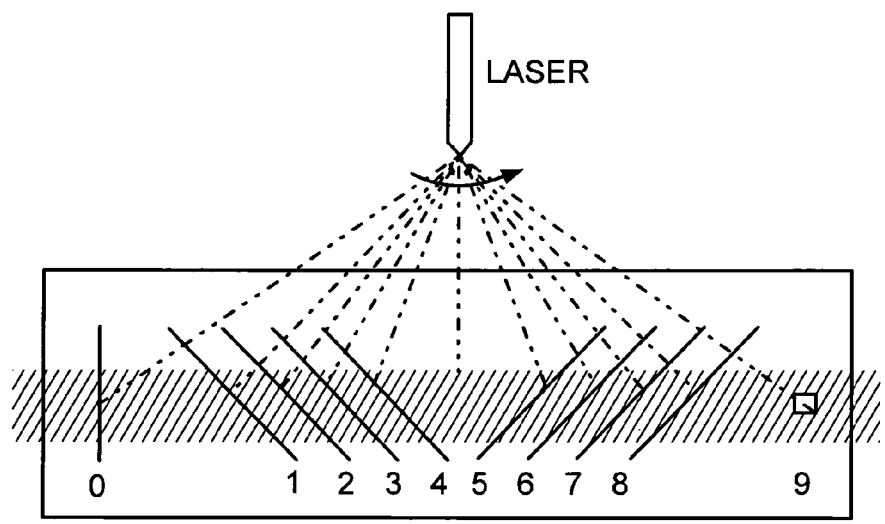
FIG. 8 shows how the single laser beam scans the chevron pattern.

Frequency block 342 takes data from VME block 340 and from pulse timing board 322 and produces frequency correction information that is sent to DDFS control block 346. Frequency block 342 performs the frequency correction portion of the AOD operation, i.e., the stripe position correction. It receives time stamp information from pulse timing board 322 and facet information from a backplane connector and VME register space. An overview of the algorithm implemented by frequency block 342 is shown in FIG. 8.

The stripe deflection implemented by frequency block 342 is a function of the following inputs: (1) the signal generated by the facet detect PMT; (2) the polygon speed command (from the VME bus); (3) the steering mirror command (from the VME bus); and (4) stored results of a calibration operation.

The facet detect PMT signal will be a series of pulses generated by the beam passing over the facet detect slit and a chevron pattern of angled slits. The timing of these pulses is decoded to determine beam position.

Measured Position from Pulse Timing Board

FIG. 8 illustrates how the laser crosses the chevron pattern in the described embodiment. There are 10 places on the chevron where the laser may go through to the underlying detector. These are labeled 0-9. Number 0 is the start of the facet (a facet is one face of the polygon, a 24 faced spinning mirror that the laser bounces off). Numbers 1-8 are the chevrons, and number 9, which is a square opening, is used to place the beam in the center of the chevrons. The measured position from the pulse timing board is sent for each of these locations. The locations of interest by the frequency algorithm are 1-8. The frequency algorithm uses the position error to perform frequency corrections.

Figure 9:
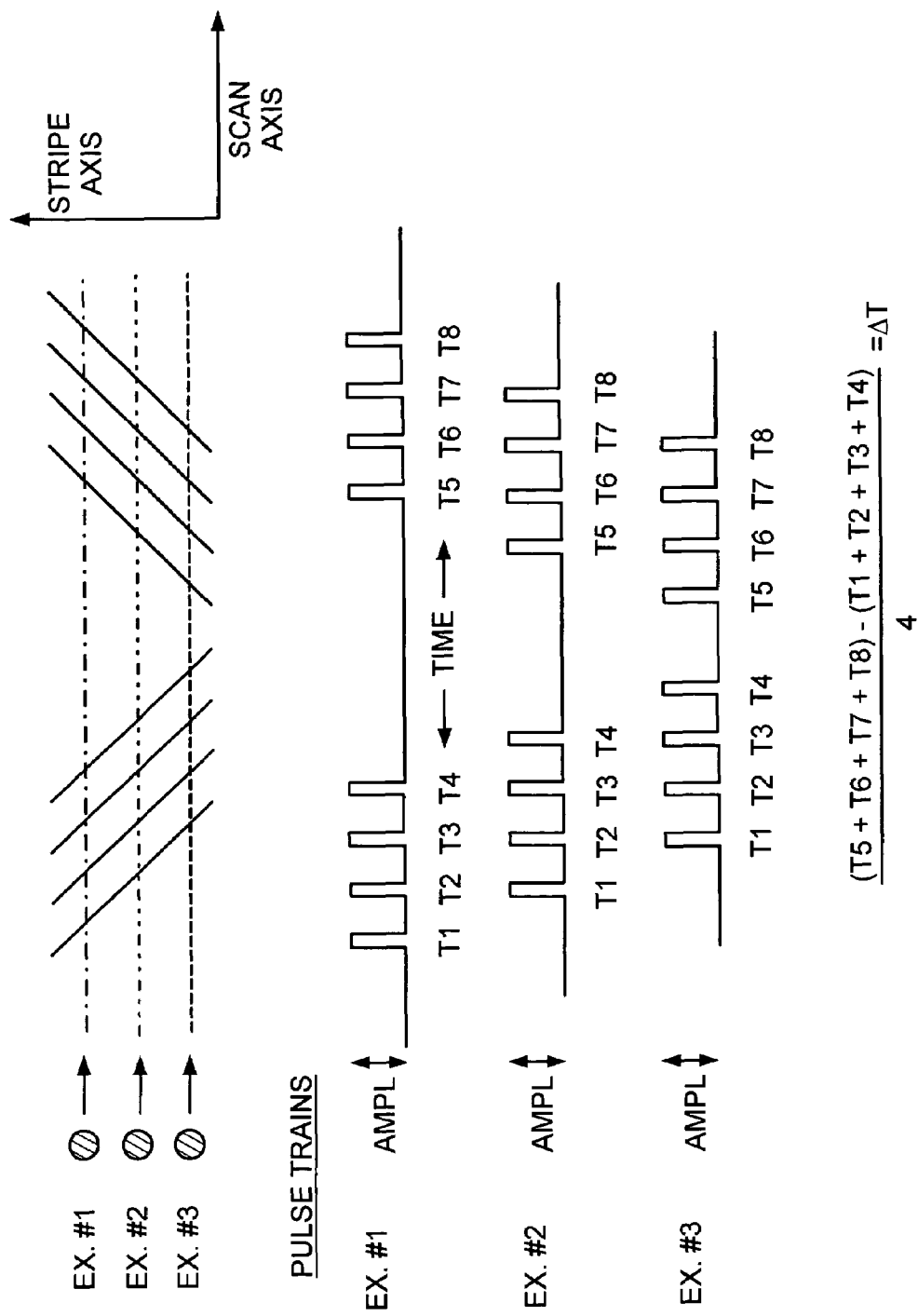
FIG. 9 illustrates the variation in pulse timing as a function of stripe position placement.

The measurement of beam position in the stripe axis is accomplished by using a chevron pattern \\\\//// of slits. This generates a "signal" made up of two sets of four pulses each. FIG. 9 illustrates the physical beam-path-to-pulse-train generation.

In the described embodiment, frequency block 342 uses the following equation to calculate the position of the beam:

Position=[(Pos5−Pos1)+(Pos6−Pos2)+(Pos7−Pos3)+(Pos8−Pos4)]/4

In reality, the measurement data are time stamps as the "laser" crosses the chevron. So the actual equation in time space is:

$\Delta T$=[(T5−T1)+(T6−T2)+(T7−T3)+(T8−T4)]/4

In the described embodiment, each item of position data is a 24-bit number that comes in the form of a 12-bit integer as its MSBs and a 12-bit "thermometer" as its LSBs. It is converted into a 16-bit number in FG module 324. The thermometer portion, which is based on a technique that is known in the art, is a way of sending a fractional position. The technique uses delay lines on the pulse timing board. The integer portion of the measured position comes from a 12-bit up counter. The thermometer is provided by a set of delay lines. The registers in front of the delay lines capture the current values of the delayed clock at the rising edge of the pulse from the chevron slits. The thermometer is created from the captured copy of delayed versions of the clock signal.

$\Delta T$ is the average time interval between the slit pairs and can be used directly to decode beam position in the stripe axis, generally with the aid of a calibration table and the polygon speed command. FIG. 9 illustrates what happens to the pulse separations as the array of beams moves up and down along the stripe axis. Assume that EX. #2 represents an aligned system whereas EX #1 and EX #3 represent deflection errors in the positive and negative directions, respectively. As can be clearly seen from the resulting pulse trains, stripe position placement errors in one direction (e.g. EX #1) cause the two arrays of four pulses to spread apart from each other; whereas stripe position placement errors in the opposite direction (e.g. EX #3) cause the two arrays of four pulses to come together. By using the four measurement averaging (i.e., four slits per set), the accuracy is improved by a factor of 2 (from sqrt(n)).

The system provides the opportunity to use the interferometry system to create calibration constants for use in converting the beam position set point command data to measured beam position. This establishes the "alignment" between the optics and the beam position slit pattern as well as the "transfer function" between the two units of measurement. Functionally, the system uses the constants to tell how far away the measured beam position is from the commanded set point and from there, how much to adjust the RF frequency.

Also, before any printing has begun, the polygon speed was set and the AOD driver has watched for this command and latched the data into its own registers. The polygon speed command sets the rotational speed of the polygon, which relates directly to the beam speed across the slit detection field. Functionally, the system measures the time between pulses and divides by the beam speed to compute the distance between the slits. This distance is linearly related to the beam position.

It should be noted that the AOD can be programmed to increase the beam intensity during the time that the beam is over the chevron and thereby increase the PMT signal to noise ratio. Then, after the beam moves past the chevron, it can again be lowered during the portion of the scan used for writing.

Figure 10:
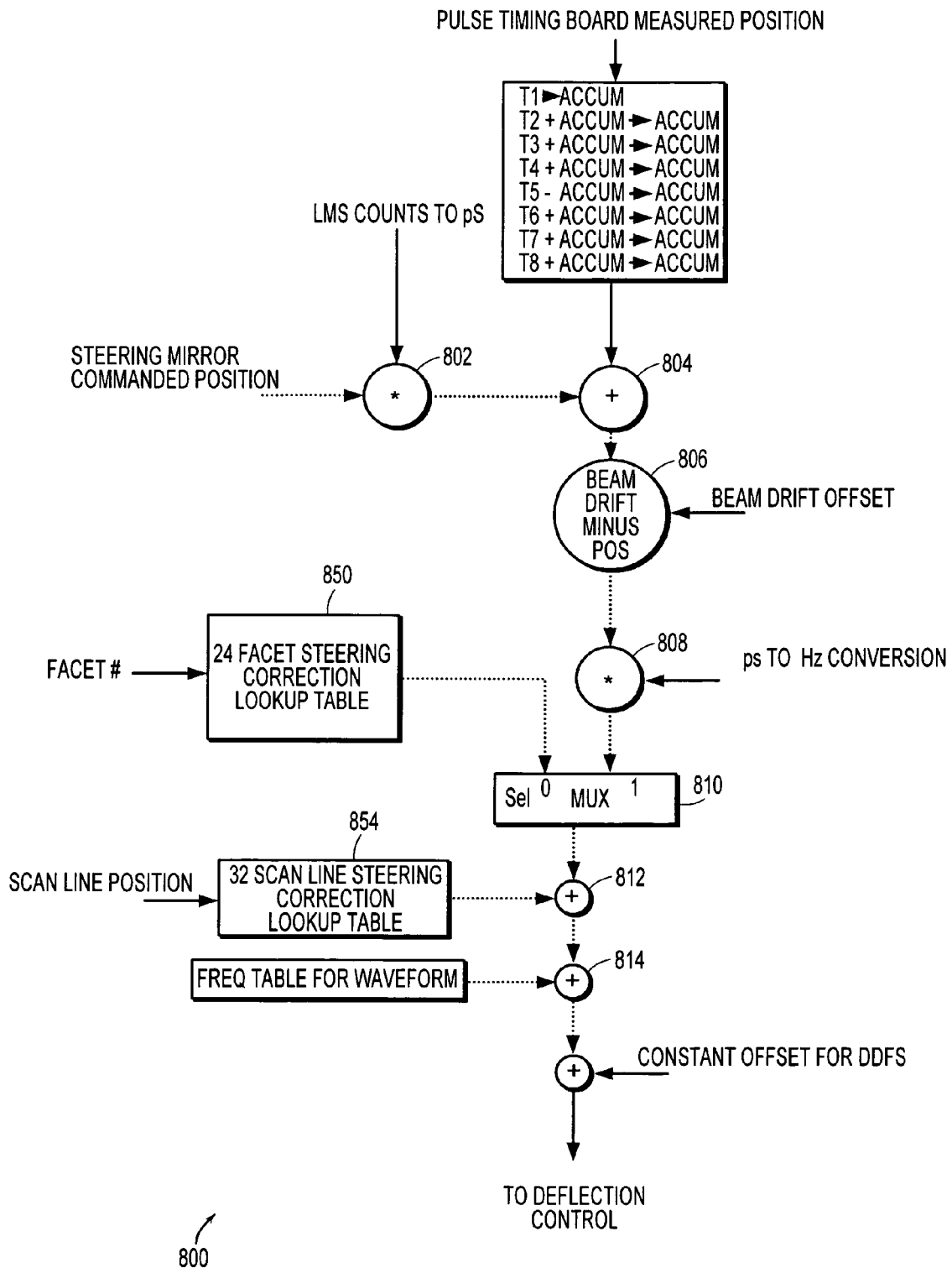
FIG. 10 is the deflection algorithm data flow map.

Referring to FIG. 10, the frequency algorithm first converts the steering mirror commanded position to the time domain of the measurement system (step 802) and then it adds the steering mirror command position to the measured position, which is the position at the Intermediate Image Plane (IIP) (step 804). The steering mirror command relates directly to the desired beam position in the stripe axis. Since there is an inversion due to the objective lens, the commanded position is inverted. Functionally, the system uses this value as the desired "set point" for beam position. The measured beam position, if different than this set point, represents the position error to be corrected.

Up to this point the measured data does not have a center point, it only varies from a minimum positive value to a maximum positive value. So, a zero point is established by a beam drift offset register to achieve a +/− drive to the rest of the system. The software makes it possible to update this zero point as needed to track any long term beam drift. The measured position and steering mirror command value is subtracted from the beam drift position (step 806).

The resulting error is then converted to a frequency command (step 808).

Then the difference between commanded set point (i.e., the steering mirror command) and measured beam position becomes the error term that is added to the current RF frequency synthesizer command.

At this point (step 810), the software selects either a dynamic control based on data sent by the pulse timing board or it bypasses the dynamic control capability in favor of using a 24 entry facet steering lookup table (LUT) 850, which has been generated during calibration of the system. The facet steering LUT contains a previously determined adjustment for each of the 24 facets of the polygonal mirror. The user has the ability to instruct the software to select one or the other through a facet steering correction LUT enable in a command register.

In either event, after the software has made this selection, it uses another table, namely, a 32 region scan line steering LUT 854, to correct for scan bow induced by the polygon not scanning exactly parallel to the axis of the F-sin(θ) and the variation in scan velocity induced placement errors. The print area is divided into 32 discrete regions, so this is a 32 entry table. The output of scan line steering LUT 854 is then added (step 812) to either the data that comes from facet steering correction LUT 850 or the data derived using commanded position minus measured position. The output of LUT 854 is selected based on the region in which printing is then taking place.

The next operation, which is user selectable, represents a test and calibration tool for use by system engineers when trying to find out what is broken in the system (step 814). It is used to evaluate the frequency response of the AOD. This operation uses a 4096 entry LUT and a rolling counter that has a software programmable limit. When enabled by the frequency response enable bit in the command register, this operation will output one entry of the LUT for each DDFS update clock, then increment the counter, and repeat until the limit has been reached. Once the limit has been reached, the counter is reset and the whole process repeats. One application of this feature is to compensate for beam stripe position error induced by stable mechanical vibrations in the system.

Finally, there is a hard coded constant based on the clock frequency and DDFS operation. The base oscillator is typically different from the zero point of the AOD device. Therefore, to generate the zero point frequency (e.g. 200 MHz), a nominal count is added, i.e., a constant frequency offset (step 816).

The result is sent to the deflection control system.

Amplitude Block

In general, the intensity correction is driven by the following inputs: (1) the facet detect PMT signal; (2) the laser intensity signal; (3) a laser power set point command; (4) look-up table values for scan line correction within each facet (24×32 values); (5) a current stripe deflection correction command; and (6) the facet value, derived from the OPR and OPF signals. The facet detect PMT signal is used to provide a start-of-facet timing pulse for calculating and applying intensity correction. As mentioned previously, a photodiode sensor inside the AOD section of the brush module produces the laser intensity signal. The brush module runs the photodiode current through a transimpedance converter with selectable gain to produce the intensity signal. This converter has multiple (e.g. three) selectable gain settings. The laser power set point signal is a digital word that indicates the laser intensity set point.

Globally, the intensity function corrects for laser intensity noise as well as a number of other varying parameters as indicated above. The correction of the laser intensity variations is a closed-loop servo, while the other operations can be regarded as open-loop corrections. Many variables combine to form a net "intensity set point" for the intensity correction loop. The loop attempts to drive the amplitude response of the AOD transducer to reproduce this intensity set point on the intensity signal. The closed loop suppresses beam intensity variations, including those caused by AOD stripe deflection commands. Some variables (gains and offsets) in the servo loop vary with the laser power setting.

Referring back to FIG. 6, in general, amplitude block 344 takes data from VME block 340 and from the photo-diode sensor and produces intensity correction information that is sent to DDFS control block 346. Amplitude block 344 makes amplitude (or gain) corrections to the RF signal being sent to the AOD in order to control the intensity of the beam exiting the AOD. Amplitude block 344 uses measured beam intensity feedback from the AOD output to perform closed loop intensity control of the beam. Amplitude values are generated based on the current diffraction efficiency set point. Corrections to the amplitude value are generated based on digitized beam intensity feedback from the AOD output, the polygon facet number, scan line position and the current frequency correction value. The main output of the amplitude block is an amplitude value that is passed to the DDFS Control block.

Figure 11:
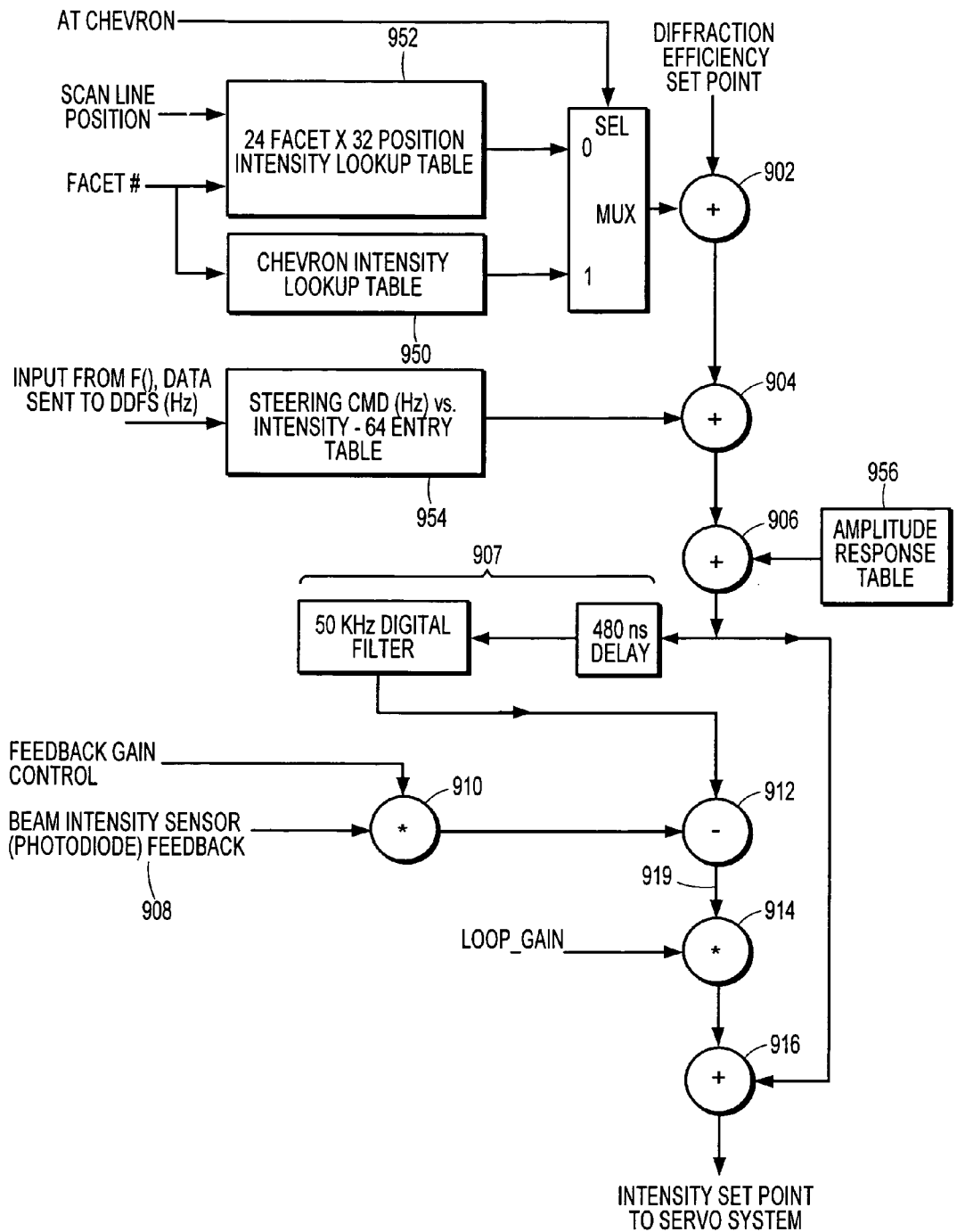
FIG. 11 is the intensity correction algorithm data flow map.

The amplitude correction algorithm is illustrated in FIG. 11.

Amplitude correction algorithm has two modes, a first mode for performing intensity or amplitude corrections during the scanning of the chevrons and a second mode for performing intensity or amplitude corrections during printing (step 900). If the first mode or chevron mode is selected, after receipt of the OPF signal, the algorithm generates an amplitude (i.e., intensity) correction for the facet detect and chevron area based on the current facet number. It uses values from a chevron intensity lookup table 950 that stores one value for each of the 24 facets.

In the second mode, the algorithm corrects for intensity variations across the scan line that are due to optical effects. It uses a 24×32 facet intensity lookup table 952 to generate 32 amplitude corrections across the scan line for each scan line.

The chevron intensity has 24 elements for the intensity over the slit pattern region. The intensity lookup table 952 includes 768 points (24 facets by 32 points/facet). The entries in these tables correct for reflection angle, facet reflectivity, and glass path-length for each individual facet. These values are determined on machine calibration and do not change in the interval between calibrations. This table corrects for both scan line intensity and facet-to-facet intensity variations. The address to the table is derived from the current Facet Number and the fractional progress of the scan through the print area (32 steps/facet) (see zone "B" in FIG. 7).

The current facet number, tracked within the AOD driver board, is required in order to compute the address for the intensity correction tables. The current facet number is derived from the OPR and OPF signal inputs. Facet number 0 is coincident with OPR. Subsequent facets after OPR are counted up from 0.

Regardless of the mode selected, the amplitude block adds the output from the corresponding table to the diffraction efficiency set point (step 902).

The next correction is an amplitude correction versus RF frequency setting. This correction for frequency versus intensity accounts for the fact that changes in the frequency of the RF signal to the AOD cause intensity changes at the AOM output. That is, stripe deflection correction has an impact on laser beam intensity. To correct these intensity changes versus RF frequency, the amplitude block uses certain bits of the RF frequency setting to address one of 64 values in the frequency versus intensity table 954. The corrections stored in this table account for sound field intensity variations across the AOM as well as for changes in AOD efficiency that are a function of drive frequency. Variations in RF driver output power versus frequency are also corrected. The amplitude block adds this value to the summation of the DE set point and the current scan line position correction (step 904).

The next correction is a user selectable test feature (step 906). There is an amplitude response table 956 that stores a waveform for testing the amplitude response (or frequency response of amplitude control) of the DDFS.

The summation (step 906) of all of the table data and the DE set point becomes the amplitude loop's new nominal set point, which is added (step 916) in with a loop feedback term to produce a feedback compensated set point.

The amplitude block receives a 12-bit photodiode feedback value from an A-to-D on the AOD driver board (step 908). The amplitude block multiplies the feedback value by a 16-bit value stored in an intensity feedback gain control register (step 910). Only the upper 16-bits of the 28-bit result are used. The feedback result is added to the summation of the DE set point and the lookup table corrections. Only the upper 16-bits of the resulting 17-bit value are used. This feedback result represents the set point except for propagation delays and bandwidth limiting. This delay and bandwidth limiting are mimicked in step 907 so that the nominal set point (step 906) arrives at the feedback summing junction (step 912) at the same time and with the same signal shaping that the original set point signal experienced on its trip through the AOD device (131 et al.). The output of step 912 is a loop error signal 919.

The amplitude block multiplies the loop error signal by a constant referred to as the loop gain setting (step 914). This result is the loop feedback term used to adjust the nominal set point (from step 906) to produce the feedback compensated set point value (step 916).

The output of the amplitude block is a digital intensity word which amplitude modulates the RF driver that energizes the AOD transducer to vary the diffraction efficiency and modulate the laser beam.

An alternative design involves using a modified integral feedback term in the amplitude correction loop instead of a purely proportional feedback term as described above. Using the modified integral feedback term will tend to improve the stability of the intensity correction loop.

Figure 12:
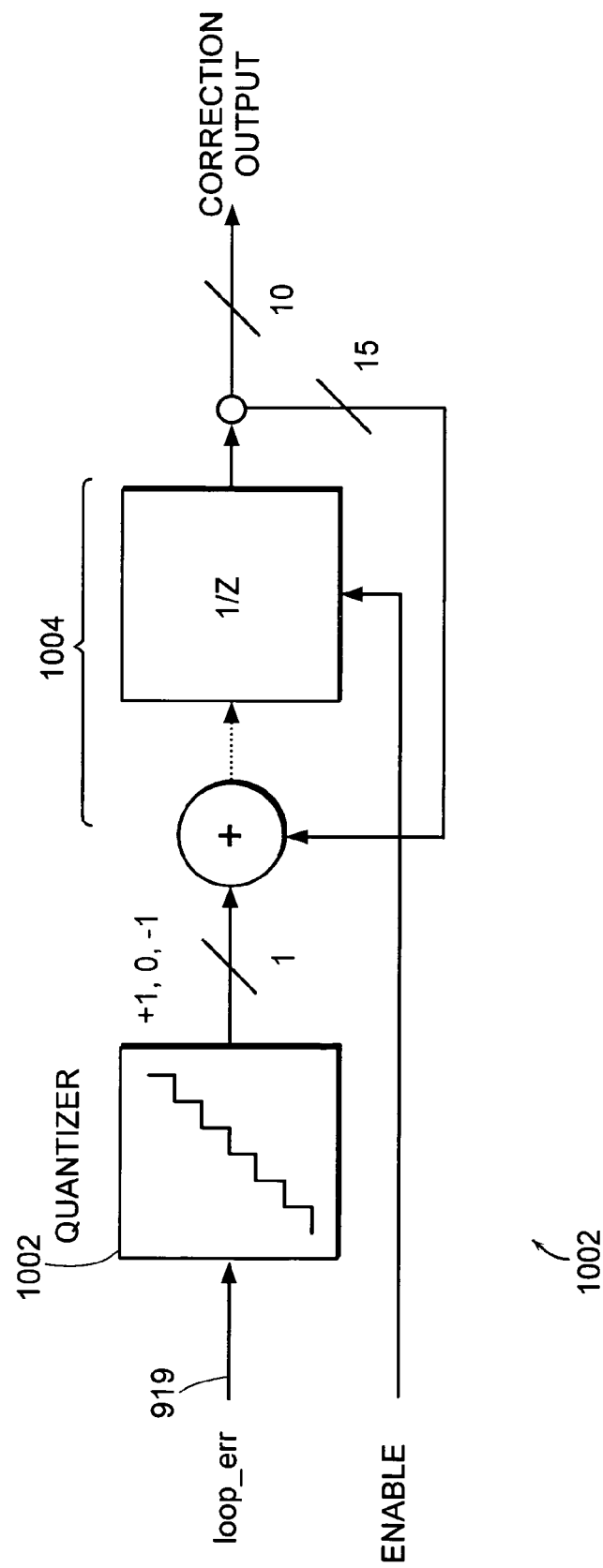
FIG. 12 is a block diagram of a modified integrator for use in the intensity correction loop.

FIG. 12 shows the block diagram of a modified integrator 1000. It in includes a quantizer 1002 following by a conventional integrator 1004. Quantizer 1002, which is added into the signal path to receive loop error signal 919, limits the integrator's response to a single count per sample period. The LSB of the "correction output" of integrator 1004 is added directly to the LSB of the (12 bit) amplitude command to the DDFS (which directly determines the AODD RF output amplitude). The correction output is formed from the most significant 11 bits (10 bits plus sign bit) out of the 15 bits that actually comprise the integrator. So, the 5 LSBs of the integrator do not drive the output amplitude. This means that an input loop error signal cannot immediately affect the output amplitude. The loop error signal must maintain a consistent polarity for $2^5$ (=32) sample periods in order to achieve a single LSB change in output amplitude (i.e., the correction output signal). Thus, a signal frequency that changes sign in less than 32 sample periods will have essentially no affect on the output. Note that this is true no matter what the amplitude of the loop error signal is because all amplitudes are quantized to unity.

In the described implementation, the sample period is 20 nsec (50 MHz). A single-frequency error signal changes sign every half cycle, so if 32 samples at 20 nsec/sample is half of a cycle, then the frequency above which this implementation will show zero response is given by:

$$1/(2*32 \text{ samples}*20 \text{ nsec/sample})=781 \text{ KHz}$$

There is an inverse ratio between maximum correction amplitude and bandwidth.

The integrator is implemented as an up/down counter with 5 "extra" bits that are not added into the amplitude control loop. These are the 5 least significant bits in the integrator. When running, the counter can change by only one bit per clock period, or zero if the loop error signal is zero.

The reason for having 5 bits that are not connected to the output (see FIG. 12) is primarily to prevent oscillation. Consider what happens when the integrator affects the LSB of the output amplitude correction. The resulting change in the feedback signal will not be observed until after the round trip loop delay has elapsed. During this time, the integrator will continue to believe that it needs to effect change. The loop delay is approximately 500 nsec. The integrator will take 25 samples in that length of time. In order to prevent the integrator from adding another (erroneous) change to the output amplitude LSB, the number of integrator samples that are required to affect the output amplitude LSB needs to be set to something greater than 25. Hence the 5 "invisible" bits, which yields 32 samples per output LSB change. Note that this performance is guaranteed by the fact that the integrator never changes value by more than one count per sample period, regardless of the amplitude of the input error signal. Also note that the effective instantaneous gain across the integrator is inversely proportional to the error signal amplitude (e.g. an input signal amplitude of 1 will produce an output of equal value for a net gain of 1/1, but an input of 10 will produce an output of 1 for a net gain of 1/10). Thus, the integrator cannot support the building up of an oscillation, which again guarantees stability.

DDFS Control

Referring back to FIG. 6, DDFS control block 346 receives data from intensity or frequency block 342 and from amplitude block 344 and it sends that data to the DDFS that is external to FG 324.

The scanning element in the embodiments described above was a rotating polygon mirror. There are, however, many other alternative scanning systems that could be used including, for example, an oscillating mirror and a rotating holographic element, just to name two.

In addition, instead of sampling the intensity signal before the AOM as described above it can be sampled elsewhere such as after the AOM. In that case a beam splitter for pulling off a small amount of the signal would be placed after the AOM. Indeed, that approach might have some advantages over sampling the signal before the AOM but it also results in a more complex system.

Several constraints exist on the design of the AOM. First, the transducers on the AOM must be sufficiently wide so that the intensity of the beams is not changed by side to side motion of the beams caused by the AOD. This limits the range of position correction. Second, if the beams are detected or sampled after the AOM instead of before the AOM, and if the zero order beam is not stopped until after the AOD, then either the center frequency of the AOD must be chosen to deflect the beams an integral number plus one half beam spacing periods or the deflection angle must be made large enough so that the first order array entirely clears the zero order array. Third, if the former technique is used, the separation of the beams at the AOM must be large enough so that the zero order beams can be stopped out between adjacent channels.

A number of embodiments of the invention have been described. It should be understood, however, that the described embodiments are not meant to be limiting, that other embodiments exist, and that various modifications may be made without departing from the spirit and scope of the different inventions described herein. Accordingly, other embodiments are within the scope of the following claims.

What is claimed is:

1. A multiple beam generator for use in a scanning system, said generator comprising:
    an acousto-optic deflector (AOD) which during use receives a laser beam and generates a deflected beam, the deflection of which is determined by an AOD control signal;
    a diffractive element which generates an array of input beams from the deflected beam;
    an acousto-optic modulator (AOM) which during use receives the array of input beams and separately modulates each of the received beams in accordance with an AOM control signal to produce an output beam array that is scanned over a scan region by the scanning system; and
    a control circuit which during operation generates the AOD control signal and varies a characteristic of the AOD control signal to account for errors in the scanning system, said errors attributable to at least one of (1) variations in beam velocity over a scan line within the scanning system, (2) intensity errors associated with the scanning system, and (3) intensity variations from stripe deflection across a sound field within the AOM.

2. The generator of claim 1 wherein the control circuit receives a feedback signal that is a measure of a deflection error of the output beam array from a desired position, wherein the control circuit generates the AOD control signal to reduce the deflection error.

3. The generator of claim 1 wherein the control circuit includes a table of corrections which the control circuit uses to generate the AOD control signal.

4. The generator of claim 3 wherein said table stores corrections for stripe position errors associated with the scanning system.

5. The generator of claim 3 wherein said table stores corrections for variation in beam velocity over a scan line within the scanning system.

6. The generator of claim 3 wherein said table stores corrections for facet-by-facet position error attributable to a polygon mirror in the scanning system.

7. The generator of claim 3 wherein said table stores corrections for intensity errors associated with the scanning system.

8. The generator of claim 7 wherein said table stores corrections for scan-line intensity variations within the scanning system.

9. The generator of claim 7 wherein said table stores corrections for intensity variation from stripe deflection across a sound field within the AOM.

10. The generator of claim 7 wherein said table stores corrections for intensity variation due to reflectivity variations within a polygonal scanning element that is part of the scanning system.

11. A beam deflection control system comprising:
    a generator that during operation generates a first array of beams;
    a scanning element that during operation receives a second array of beams derived from the first array of beams and scans the second array of beams over a scan region;
    a deflection measurement circuit including a chevron pattern detector across which one of the beams of the scanned array of beams scans during operation, said chevron pattern detector generating a signal that is a measure of the location of the scanned array of beams in a direction transverse to the scan direction, said chevron pattern detector including an angled slit across which said one of the beams passes; and
    a control circuit which during operation receives a feedback signal from the deflection measurement circuit that is a measure of a deflection error between the output beam array and a desired position, wherein the control circuit generates the first control signal to reduce the deflection error.

12. The system of claim 11 wherein said generator comprises:
    an acousto-optic deflector which during use receives a laser beam and generates a deflected beam, the deflection of which is determined by a first control signal; and
    a diffractive element which generates the first array of beams from the deflected beam.

13. The system of claim 11 wherein the chevron pattern detector also includes a vertical slit across which the said one of the beams passes.

14. The system of claim 11 wherein the chevron pattern detector also includes a vertical slit and a plurality of angled slits across which the said one of the beams passes, said first-mentioned angled slit being one of said plurality of angled slits.

15. The system of claim 11 wherein the chevron pattern detector also includes a vertical slit, a first plurality of angled slits and a second plurality of angled slits symmetrically oriented with respect to the first plurality of slits, wherein the said one of the beams passes over the vertical slit and the first and second plurality of slits and wherein said first-mentioned angled slit is one of said first plurality of angled slits.

16. The system of claim 11 wherein the chevron pattern detector is characterized by a path along which the said one of the beams passes during operation and wherein the chevron pattern detector further includes a detector region along said path for determining whether the beam is properly aligned over said path.

17. The generator of claim 1 further comprising a deflection measurement circuit including a detector across which one of the beams of the scanned array of beams scans during operation, said detector generating a feedback signal that is a measure of the location of the scanned array of beams in a direction transverse to the scan direction, said detector including an angled slit across which said one of the beams passes, wherein the control circuit is adapted to receive the feedback signal generate the AOD control signal to reduce the deflection error.

18. The generator of claim 17 wherein the detector also includes a vertical slit across which the said one of the beams passes.

19. The generator of claim 17 wherein the detector also includes a vertical slit and a plurality of angle slits across which the said one of the beams passes, said first-mentioned angled slit being one of said plurality of angled slits.

20. The generator of claim 17 wherein the detector also includes a vertical slit, a first plurality of angled slits and a second plurality of angled slits symmetrically oriented with respect to the first plurality of slits, wherein the said one of the beams passes over the vertical slit and the first and second plurality of slits and wherein said first-mentioned angled slit is one of said first plurality of angled slits.

21. The generator of claim 17 wherein the detector is characterized by a path along which the said one of the beams passes during operation and wherein the chevron pattern detector further includes a detector region along said path for determining whether the beam is properly aligned over said path.

* * * * *